US006650080B1

(12) United States Patent
Guttenberger

(10) Patent No.: US 6,650,080 B1
(45) Date of Patent: Nov. 18, 2003

(54) ACTUATING MECHANISM FOR SETTING A MANIPULATABLE MEMBER IN AT LEAST TWO DEGREES OF FREEDOM

(75) Inventor: Richard Guttenberger, Nürnberg (DE)

(73) Assignee: Bühler Motor GmbH, Nürnberg (DE)

( * ) Notice: Subject to any disclaimer, the term of this patent is extended or adjusted under 35 U.S.C. 154(b) by 455 days.

(21) Appl. No.: 09/691,093

(22) Filed: Oct. 19, 2000

(30) Foreign Application Priority Data

Oct. 23, 1999 (DE) ......................................... 199 51 077

(51) Int. Cl.⁷ ............................................... B60R 1/072
(52) U.S. Cl. ...................................... 318/663; 318/286
(58) Field of Search ................................ 318/663, 264, 318/265, 266, 286, 466, 467, 468; 307/9.1, 10.1; 361/736, 738, 760, 761, 763, 772

(56) References Cited

U.S. PATENT DOCUMENTS

| | | | |
|---|---|---|---|
| 4,266,856 A | * | 5/1981 | Wainwright |
| 4,670,679 A | | 6/1987 | Koot et al. |
| 4,915,493 A | * | 4/1990 | Fisher et al. |
| 5,080,492 A | * | 1/1992 | Platzer, Jr. |
| 5,233,228 A | * | 8/1993 | Krieg |
| 5,343,333 A | | 8/1994 | Nagayama et al. |
| 5,773,947 A | | 6/1998 | Torii et al. |
| 5,907,139 A | | 5/1999 | Fukatsu et al. |

FOREIGN PATENT DOCUMENTS

| | | |
|---|---|---|
| DE | 197 24 725 | 2/1999 |
| EP | 0 926 804 | 6/1999 |
| JP | 11255029 | 12/1999 |
| NL | 9 200 412 | 5/1993 |
| WO | 98 31565 | 7/1998 |
| WO | 99/35712 | 7/1999 |
| WO | 01/07291 | 2/2001 |

* cited by examiner

*Primary Examiner*—Bentsu Ro
(74) *Attorney, Agent, or Firm*—Jacobson Holman PLLC

(57) ABSTRACT

An actuating mechanism for setting a manipulatable member in at least two degrees of freedom of movement. The actuating mechanism includes at least one drive motor, whose output shaft is gear-connected to a manipulatable member-driven reduction gear, and includes two potentiometers, which measure the actual position of the manipulatable member and are mounted on a printed circuit board and include resistance paths and wipers and a drive housing. The actuating mechanisms are constructed at least in part modularly and where the function of the potentiometer can be tested before installation into the actuating mechanism. The actuating mechanism includes as few components as possible, can be mounted as easily as possible, and its potentiometer can be mounted easily without play with reference to the manipulatable member and/or the reduction gear. The printed circuit board includes a deflector, which is at least partially embedded in plastic material and electrically connects the ends of the individual resistance paths to the contact points so that the resistance paths are carried between their ends by the plastic material. The wipers are fastened on wiper carriers, which are in the form of gearwheels, frictional wheels or crank disks, are pivot-mounted on the printed circuit board and are gear-connected to the reduction gear and/or the manipulatable member. The printed circuit board is bent at an angle at at least one point so that the resistance paths of both potentiometers are configured in different planes. The circuit board with the potentiometers and the contact points form one component, with the two potentiometers of the component being easily rigidly mounted.

17 Claims, 3 Drawing Sheets

ACTUATING MECHANISM FOR SETTING A MANIPULATABLE MEMBER IN AT LEAST TWO DEGREES OF FREEDOM

FIELD OF THE INVENTION

The present invention relates to an actuating mechanism for setting a manipulatable member in at least two degrees of freedom of movement. The actuating mechanism includes at least one drive motor, whose output shaft is gear-connected to a manipulatable member driven reduction gear, and includes two potentiometers, which measure the actual position of the manipulatable member and are mounted on a printed circuit board and include electrical resistance paths, electrical contacting wipers and a drive housing.

BACKGROUND OF THE INVENTION

German Patent PS 197 24 725 discloses a device for electrically setting the inside and outside mirror of a motor vehicle. The device provides as the adjusting elements two electric minimotors, which are held in a drive housing and which are driven electrically by a printed circuit board provided with at least one conducting and one resistance path. In the case of this prior art drive, the wipers are mounted separately from the printed circuit board on other components. Thus, the function of the potentiometer cannot be tested until it is mounted.

SUMMARY OF THE INVENTION

The object of the invention is to provide an actuating mechanism for setting a manipulatable member in at least two degrees of freedom of movement. The actuating mechanism is constructed at least in part modularly, so that one function of the potentiometer can be tested before installation into the actuating mechanism, which includes as few components as possible, can be mounted as easily as possible and whose potentiometer can be mounted easily without play with reference to the manipulatable member and/or the reduction gear.

The invention solves this problem in that the printed circuit board includes a deflector, which is at least partially embedded in plastic material and electrically connects the ends of the individual resistance paths to the contact points so that the resistance paths are carried between their ends by the plastic material. The contact point wipers are fastened on wiper carriers, which are designed in the form of gearwheels, frictional wheels or crank disks, are pivot-mounted on the printed circuit board and are gear-connected to the reduction gear and/or the manipulatable member. The printed circuit board is bent at an angle at at least one point, whereby the resistance paths of both potentiometers are configured in different planes, and the circuit board with the potentiometers and the contact points form one component, whereby the two potentiometers of the component are not mounted rigidly.

The design of the circuit board as a deflector, embedded in plastic material, makes it possible to make the circuit board any arbitrary shape so that it can also be adapted to complicated installation conditions. The contact points make it easier to make contacts and to install the circuit board. Mounting the carriers for the electrical contact wipers on the circuit board enables manufacture of a component with complete potentiometers. Thus, the component can be produced separately and its function can be tested before installation into the actuating mechanism.

The design of the carriers for the electrical contact wipers as gearwheels, frictional wheels or crank disks facilitates the mechanical coupling of the potentiometers to the reduction gear and/or the manipulatable member. By bending down the circuit board at an angle, the potentiometers can be installed in different planes. Nevertheless, installation of the potentiometers in one plane prior to bending down is possible, a state that is better for production. Since the two potentiometers are not rigidly arranged relative to each other, it is possible to balance the tolerances and thus the play between the potentiometers and the reduction gear and/or the manipulatable member.

It is advantageous for the plastic material of the printed circuit board to be made as one piece with the fastening means for fastening the circuit board in the drive housing. Thus, additional parts for attachment are superfluous. The assembly is easier if the circuit board is designed so as to snap into the drive housing.

To obtain freedom from play between the carriers for the electrical contact wipers and the reduction gear and/or the manipulatable member, it is advantageous for the circuit board to be designed in such a manner that it can be tilted to a limited degree in the drive housing. Thus, it is easier to produce and maintain the alignment between drive housing, circuit board and reduction gear, when the circuit board is in the drive housing. Preferably there are guides, which extend at a right angle to the axis of the gear elements, which are coupled directly to the wiper carriers of the potentiometers.

An especially advantageous design of the invention consists of the deflector being designed as one piece with the springy areas, because in this manner freedom from play can be produced between the wiper carrier and a gear element. Preferably the circuit board is divided into three areas; into a contact area and two potentiometer areas, whereby the contact area is connected, on the one hand, via several conducting paths of the deflector to the one potentiometer and, on the other hand, to the other potentiometer area; and the conducting paths form the springy areas. This design is especially compact, because the design of the conducting paths makes it possible to set the spring force. Preferably the circuit board is bent in such a manner that the installation of the drive housing results in a prestress.

It is logical to precisely run the potentiometer areas in the guides, since they lie in the vicinity of the plane of the wiper carriers. Furthermore, each potentiometer area is provided with one connecting part, into which a complementary connecting part of the housing can be snapped. In so doing, it is important, especially when it involves a ball joint and not a cylindrical joint, that at least one possible swivel axis runs parallel to the axis of rotation of the corresponding drive element in order to make it possible for the respective potentiometer area to swing to a limited degree with respect to the gear element.

To pivot-connect the wiper carriers to the circuit board, the wiper carriers are mounted on the circuit board using a rotating snap connection. To ensure that the wiper carrier is in an optimal position relative to the gear element with which it meshes and to ensure that the position is adequately stable, the circuit board has additional guides, which guarantee tilt-proof positioning of the wiper carrier.

The contact area makes it possible for the circuit board to make easy contact. The contact area can be connected as a component of the circuit board to the at least one drive motor by simply inserting into the connector of the drive housing.

In specific embodiments it can be advantageous to electrically and mechanically connect the drive motor(s) to the circuit board. Thus, it is not necessary to provide additional measures for the contacting of the motors in the drive housing.

It is possible to guarantee contact if the contact points of the contact area comprise two or four opposing tongue-shaped contacts, in which the corresponding counter contacts comprise flat contact tags or contact pins, whose thickness is greater than a free space between the tongue-shaped contacts. When inserting, these tongue-shaped contacts become snagged in the contact tags or pins and maintain the connection. It is possible to have an even smaller number of components, if the drive housing is made as one piece with the circuit board.

The uncovered problem is solved by the following inventive process:

punch deflector with conducting paths, whereby a holding frame and/or holding webs are left as auxiliary means to hold the conducting paths;

embed parts of the deflector in plastic material;

print circuit board in resistance paths;

harden the resistance paths;

remove the holding frame and/or the holding webs; and bend the circuit board.

This process makes it possible to produce the potentiometers in the traditional manner, because the main components of the circuit board are arranged, first of all, in one plane. Even the punching of the deflector, the embedding and the removal of the holding frame can be accomplished in a simple manner as long as the circuit board has not yet been bent. Bending the board results in a special shape that is mandated by the respective application. Of course, applications without having to bend the circuit board are also conceivable.

BRIEF DESCRIPTION OF THE DRAWINGS

In the following, at least one embodiment of the invention is explained in detail with reference to the drawings.

FIG. 1b is an enlarged view of a portion of FIG. 1a.

FIG. 2b is a detail of a top view of FIG. 2a looking in a direction of arrow Z of FIG. 2a.

DETAILED DESCRIPTION OF THE PREFERRED EMBODIMENTS

Figure 1A:
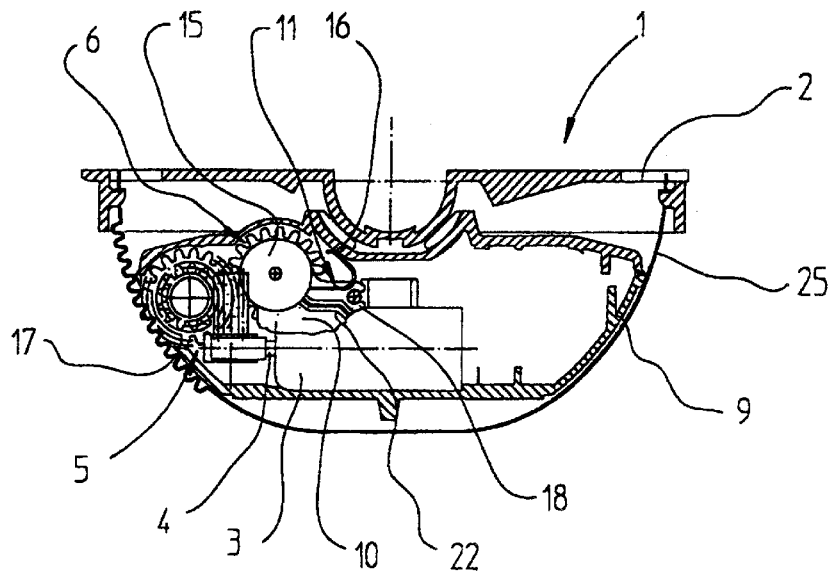
FIG. 1a is a sectional view of an actuating mechanism of the invention.

FIG. 1a is a sectional view of an actuating mechanism 1 of the invention, which is designed here as a drive for a motor vehicle rearview mirror. The actuating mechanism comprises a manipulatable member 2, depicted here as a mirror glass carrier, and a drive housing 9, in which two drive motors 3 (only one drive motor, etc. can be seen) are accommodated so as to position and force lock the drive housing.

The output shafts 4 of the drive motors engage with one reduction gear 5; their output gear wheels 17 mesh with one adjusting element 25, which is connected to the manipulatable member 2. The actuating mechanism also comprises a circuit board 10, which is fastened so as to shape and/or be force locked in the drive housing 9 and accommodates, so as to be pivot mounted, two wiper carriers 15, as the first part of a potentiometer 6, which interact with the resistance paths 7, as the second part of the potentiometer 6 and/or conducting paths on the circuit board 10, whereby the wiper carriers 15 are designed in the shape of gearwheels, of which each meshes with a gear wheel 17 of each respective reduction gear 5.

The circuit board 10 is mounted by means of snap connections 18 in the drive housing 9 so as to swing in part around the snap connection connecting points. The circuit board 10 comprises in essence a deflector 11, that shows the conducting paths 22 as electrical connections between the drive motors 3, the resistance paths 7 and the connections inside the drive housing 9. The deflector 11 exhibits at least one springy area 16, with whose aid at least one of the wiper carriers 15 engages without play with one of the gear wheels 17.

Figure 1B:
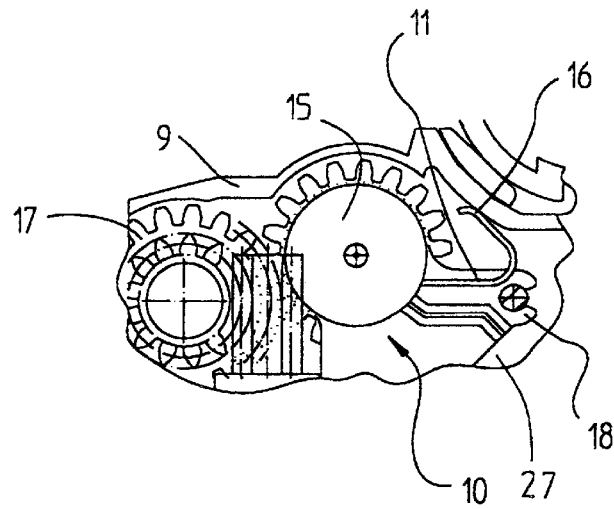

FIG. 1b is an enlarged view of the circuit board 10 with the snap connection 18 in the drive housing 9, the deflector 11, the wiper carrier 15 and the gear wheel 17. The gear wheel 17 is preferably the output gear wheel or runs at the same circumferential speed as the output gear wheel so that the wiper carrier 15, which engages with the gear wheel 17, runs in synchronism with the manipulatable member without reduction or translation. The drive housing 9 has guides 27, in which parts of the circuit board 10 can be guided for placement.

Figure 2A:
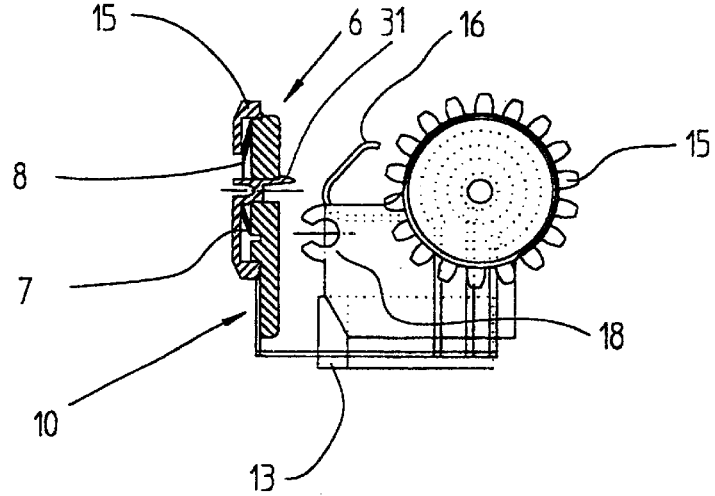
FIG. 2a is a sectional view of a circuit board.

FIG. 2a depicts the circuit board 10 bent at an angle so that both wiper carriers 15 are at a right angle to each other. The wiper carriers include wipers 8, which make electrical contact with the resistance paths 7 and the conducting paths. The wiper carriers 15 are pivot-mounted on the circuit board 10 by means of a rotating snap connection 31. The springy areas 16 are preferably, parts of the deflector and hold one wiper carrier 15, whereby the part of the circuit board 10, which carries the wiper carrier 15 can be swung slightly around the snap connection 18 until the gear engagement between the wiper carrier 15 and the gear element 17 is without play. The deflector 11 is embedded only partially with plastic material; the exposed parts of the deflector 11 can also exert by itself an adequate springy effect on the wiper carrier 15.

Figure 2B:
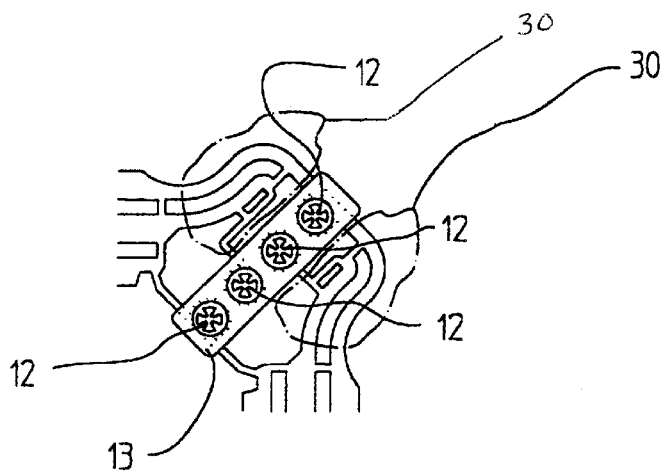

In FIG. 2b the two springy areas 30 are shown. Between the two springy areas 30 there is a contact area 13, which is embedded in part with plastic material. The contact area 13 includes contact points 12, which can be designed in such a manner that they can be inserted into contact pins. In that case they exhibit a retaining effect.

Figure 3:
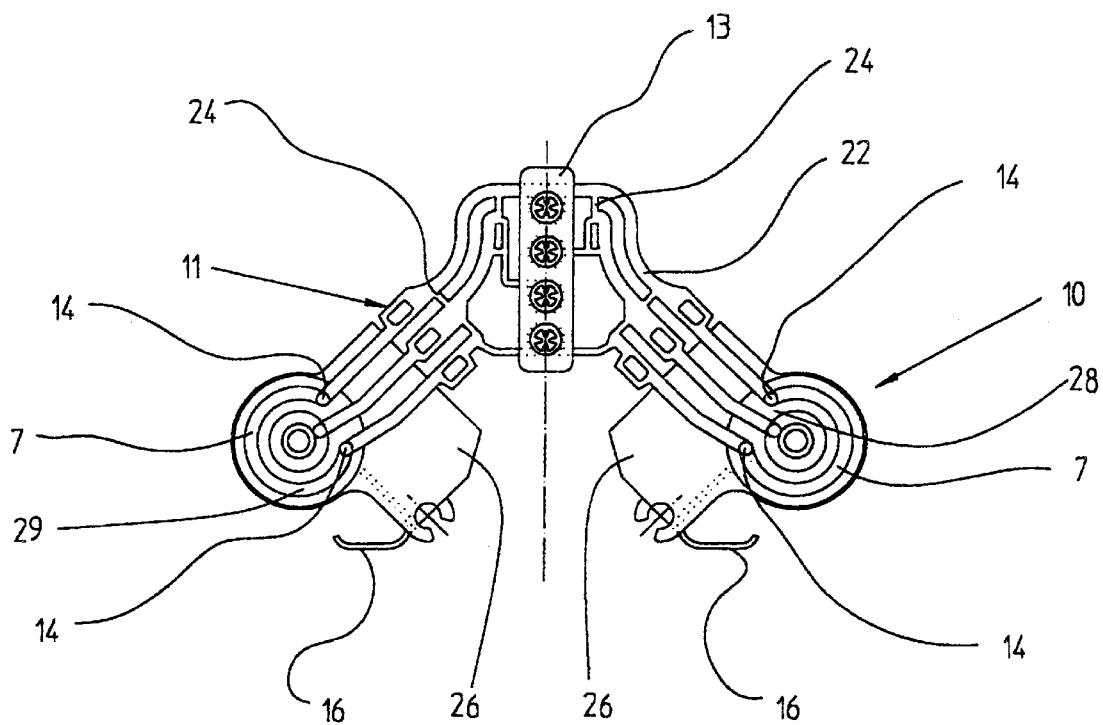
FIG. 3 is a top view of a non-bent circuit board.

FIG. 3 depicts a non-bent circuit board 10, with the deflector 11, whose individual conducting paths are connected together by means of holding webs 24, which are interrupted or punched after positioning the deflector 11. The ends 14 of the resistance paths 7 are connected electrically to the conducting paths 22 in potentiometer area 28, 29. The springy areas 16 can be omitted at the deflector 11, if the springy areas 30 exhibit adequate springy effect.

To ensure that the circuit board 10 and thus the wiper carriers 15 remain in alignment with respect to the gear element 17, guide areas 26 are provided on the circuit board 10, which can be accommodated in corresponding guides 27 on the drive housing 9. Preferably the guides 27 are designed in such a manner on the drive housing 9 that they guide the circuit board 10 on both sides.

Figure 4A:
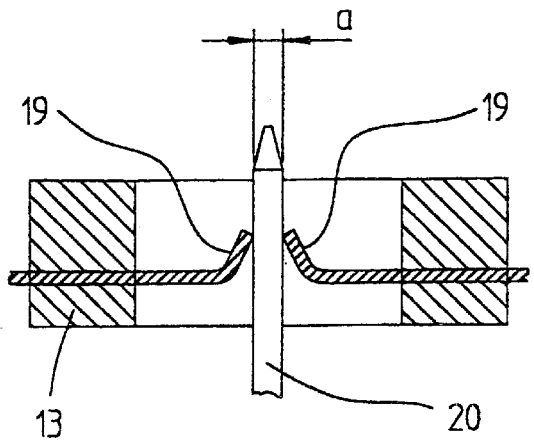
FIG. 4a is a sectional view of a contact point.
Figure 4B:
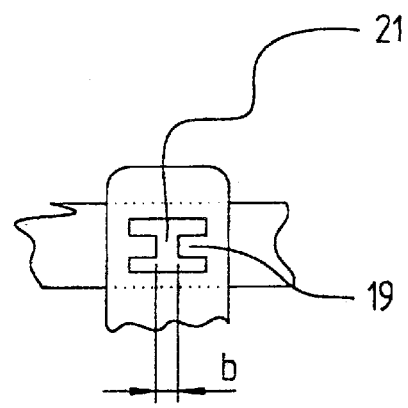
FIG. 4b is a top view of a first alternative of the contact point.
Figure 4C:
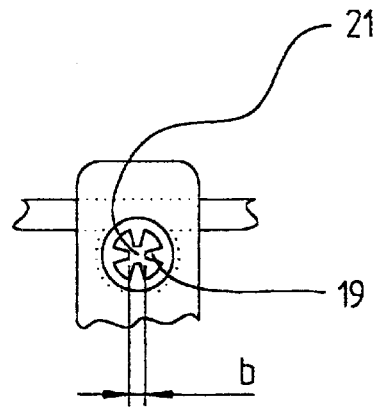
FIG. 4c is a top view of a second alternative of the contact point.

FIG. 4a is a sectional view of the contact area 13, with tongue-shaped contacts 19, into which a flat pin-like counter contact 20 is plugged. FIG. 4b is a top view of a first alternative of a contact point, with the tongue-shaped contacts 19, which are separated from each other by a free space 21 having width b. The width b is less than the diameter a of the counter contact 20. FIG. 4c depicts a second alternative of a contact point, where there are four tongue-shaped contacts 19.

The foregoing description should be considered as illustrative only of the principles of the invention. Since numerous modifications and changes will readily occur to those skilled in the art, it is not desired to limit the invention to the exact construction and operation shown and described, and, accordingly, all suitable modifications and equivalents may be resorted to, falling within the scope of the invention.

I claim:

1. Actuating mechanism for setting a manipulatable member in at least two degrees of freedom of movement, said actuating mechanism comprising
   a drive housing,
   at least one drive motor,
   an output shaft of said at least one drive motor being gear-connected to a manipulatable member-driven reduction gear,
   two potentiometers measuring a position of the manipulatable member and being mounted on a printed circuit board including resistance paths and wipers, the printed circuit board including a deflector, at least partially embedded in plastic material of said printed circuit board and electrically connecting ends of individual ones of said resistance paths to contact points, the resistance paths being carried between their ends by the plastic material of said printed circuit board, the wipers being fastened on wiper carriers in the form of gearwheels, pivot-mounted on the printed circuit board and gear-connected to one of the manipulatable member-driven reduction gears and the manipulatable member, the printed circuit board being bent at an angle at at least one point, whereby the resistance paths of both potentiometers are configured in different planes, and the circuit board with the potentiometers and the contact points form one component.

2. Actuating mechanism, as claimed in claim 1, wherein the plastic material of the printed circuit board is one piece with a fastening means for fastening the circuit board in the drive housing.

3. Actuating mechanism, as claimed in claim 1, wherein the printed circuit board snaps into the drive housing.

4. Actuating mechanism, as claimed in claim 1, wherein at least one part of the printed circuit board is tiltable to a limited degree in the drive housing.

5. Actuating mechanism, as claimed claim 1, wherein the printed circuit board is guided in the drive housing.

6. Actuating mechanism, as claimed in claim 5, wherein guides are at a right angle to an axis of gear elements coupled directly to the wiper carriers of the potentiometers.

7. Actuating mechanism, as claimed in claim 6, wherein the deflector is one piece with springy areas producing freedom of play between the wiper carrier and a gear element.

8. Actuating mechanism, as claimed in claim 7, wherein the circuit board is divided into a contact area and two potentiometer areas, the contact area is connected, on the one hand, via several conducting paths of the deflector to one potentiometer area and, on the other hand, to the other potentiometer area, whereby the conducting paths form the springy areas.

9. Actuating mechanism, as claimed in claim 8, wherein the potentiometer areas are provided with guide areas so as to tilt in guides of the drive housing.

10. Actuating mechanism, as claimed in claim 8, wherein each of the two potentiometer areas is provided with one connecting part as part of a snap connection with said drive housing, said connecting part is snapable into a complementary connecting part of the drive housing.

11. Actuating mechanism, as claimed in claim 10, wherein at least one swivel axis of each snap connection runs parallel to an axis of rotation of a corresponding gear element.

12. Actuating mechanism, as claimed in claim 1, wherein the wiper carriers are rotatable in the circuit board by rotating snap connections.

13. Actuating mechanism, as claimed in claim 1, wherein the wiper carriers are guided by guides provided on the circuit board and on the drive housing.

14. Actuating mechanism, as claimed in claim 1, wherein said at least one drive motor is connected electrically and mechanically to the circuit board.

15. Actuating mechanism, as claimed in claim 1, wherein the circuit board is electrically connected via a contact area to conductors of the drive housing.

16. Actuating mechanism, as claimed in claim 15, wherein contact points of the contact area comprise opposing tongue-shaped contacts, with corresponding counter contacts including flat contact pins, having a thickness greater than a free space between the tongue-shaped contacts.

17. Actuating mechanism, as claimed in claim 1, wherein the drive housing is made as one piece with the circuit board.

* * * * *